United States Patent
Chao et al.

(10) Patent No.: US 11,693,043 B2
(45) Date of Patent: Jul. 4, 2023

(54) TEST HEAD ASSEMBLY FOR SEMICONDUCTOR DEVICE

(71) Applicant: Powertech Technology Inc., Hukou Township, Hsinchu County (TW)

(72) Inventors: Ying-Tang Chao, Hukou Township, Hsinchu County (TW); Yen-Yu Chen, Hukou Township, Hsinchu County (TW); Shin-Kung Chen, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 22 days.

(21) Appl. No.: 17/467,045

(22) Filed: Sep. 3, 2021

(65) Prior Publication Data
US 2022/0334168 A1    Oct. 20, 2022

(30) Foreign Application Priority Data
Apr. 19, 2021   (TW) .................................. 110113998

(51) Int. Cl.
*G01R 31/26* (2020.01)
*G01R 1/073* (2006.01)

(52) U.S. Cl.
CPC ..... *G01R 31/2601* (2013.01); *G01R 1/07314* (2013.01)

(58) Field of Classification Search
CPC ................ G01R 31/26; G01R 31/2601; G01R 1/07314; G01R 1/073
USPC ...................................... 324/756.04
See application file for complete search history.

(56) References Cited

U.S. PATENT DOCUMENTS

| | | | | |
|---|---|---|---|---|
| 5,436,567 | A * | 7/1995 | Wexler | G01R 1/07335 324/755.05 |
| 2006/0006892 | A1* | 1/2006 | Green | G01R 31/2886 324/754.03 |
| 2008/0231296 | A1* | 9/2008 | Schaule | G01R 31/2887 324/754.08 |

FOREIGN PATENT DOCUMENTS

TW   201932851 A   8/2019

* cited by examiner

*Primary Examiner* — Lee E Rodak
*Assistant Examiner* — Courtney G McDonnough
(74) *Attorney, Agent, or Firm* — patenttm.us

(57) ABSTRACT

A test head assembly for a semiconductor device has a carrier, a pin seat and a test wire assembly. The carrier is formed in an L shape and has a lateral board, a perpendicular board and a opening formed through the perpendicular board. The pin seat is mounted in the corresponding opening. The test wire assembly has a test head, a plurality of connectors and a plurality of test wires. The test head is mounted on an outer sidewall of the lateral board and connected to the pin seat through the test wires and the connectors. Therefore, the pin seat is mounted on the perpendicular board of the L-shaped uprightly and the test head is mounted on the lateral board. The pin seat and the test head are not parallel to each other, and a lateral size of the test head assembly is reduced to increase the space usage.

20 Claims, 7 Drawing Sheets

TEST HEAD ASSEMBLY FOR SEMICONDUCTOR DEVICE

CROSS-REFERENCE TO RELATED APPLICATIONS

This application is based upon and claims priority under 35 U.S.C. 119 from Taiwan Patent Application No. 110113998 filed on Apr. 19, 2021, which is hereby specifically incorporated herein by this reference thereto.

BACKGROUND OF THE INVENTION

1. Field of the Invention

The present invention is related to test equipment for a semiconductor device, and more particularly to a test head assembly for a semiconductor device.

2. Description of the Prior Arts

After a semiconductor device is fabricated, a functionality of the semiconductor device has to be tested by test equipment. In the test procedure, the semiconductor devices are placed in the test equipment, and the test equipment tests electrical characteristics for each semiconductor device by different requirements to verify whether the functionality of the semiconductor device is normal or not.

With reference to a Taiwan invention patent (publication No. TW201932851A), imaging test equipment is disclosed. As shown in FIG. 7, the semiconductor image test equipment 80 has a test carrier 81, a test interface board 82, a base 83, a pin car 84 and a plurality of pins 85. The test carrier 81 may be connected to different test cards for different test requirements. The test carrier 81 is electrically connected to the pin car 84 through the test interface board 82 and the base 83. A plurality of pins 85 of the pin card 84 are electrically connected to a plurality of pads on a wafer 87 mounted on a platform 86 and the wafer 87 is tested according to the functions of the test carrier 81.

Since the test carrier 81, the test interface board 82, the base 83 and the pin car 84 are horizontally assembled in the semiconductor image test equipment 80 and are parallel to each other, a lateral size of the semiconductor image test equipment 80 can not be further reduced.

To overcome the shortcomings, the present invention provides a test head assembly for a semiconductor device to mitigate or to obviate the aforementioned problems.

SUMMARY OF THE INVENTION

An objective of the present invention is to provide a test head assembly for a semiconductor device to obviate the aforementioned problem.

To achieve the objective as mentioned above, the test head assembly for the semiconductor device has:
a carrier formed in an L shape and having a lateral board and a perpendicular board, wherein at least one opening is formed through the perpendicular board;
at least one pin seat mounted in the corresponding opening and having a plurality of pins, wherein each of the pins has an inner end and an outer end, the inner end protrudes from an inside of the perpendicular board, and the outer end protrudes from an outside of the perpendicular board; and
a test wire assembly having:
a test head mounted on an outer sidewall of the lateral board and having a plurality of micro-probes;
a plurality of connectors respectively connected to the outer ends of the pins of the at least one pin seat; and
a plurality of test wires respectively connected between the micro-probes and the connectors and positioned alongside the outer sidewall of the lateral board and the outside of the perpendicular board.

As mentioned above, the test head assembly of the present invention provides an L-shaped carrier and the at least one pin seat is mounted on the perpendicular board, so the at least one pin seat is substantially vertical to the lateral board, and the test head is mounted on the lateral board. Therefore, the test head assembly occupies less lateral space and the pin seat, and the test head and the pin seat are not parallel to each other. A lateral size of the test head assembly is reduced to increase space usage. An accuracy and stability of controlling the test head are increased accordingly.

Other objectives, advantages and novel features of the invention will become more apparent from the following detailed description when taken in conjunction with the accompanying drawings.

DETAILED DESCRIPTION OF THE EMBODIMENTS

The present invention is related to test equipment for a semiconductor device. With embodiments and drawings thereof, the features of the present invention are described in detail as follows.

Figure 1:
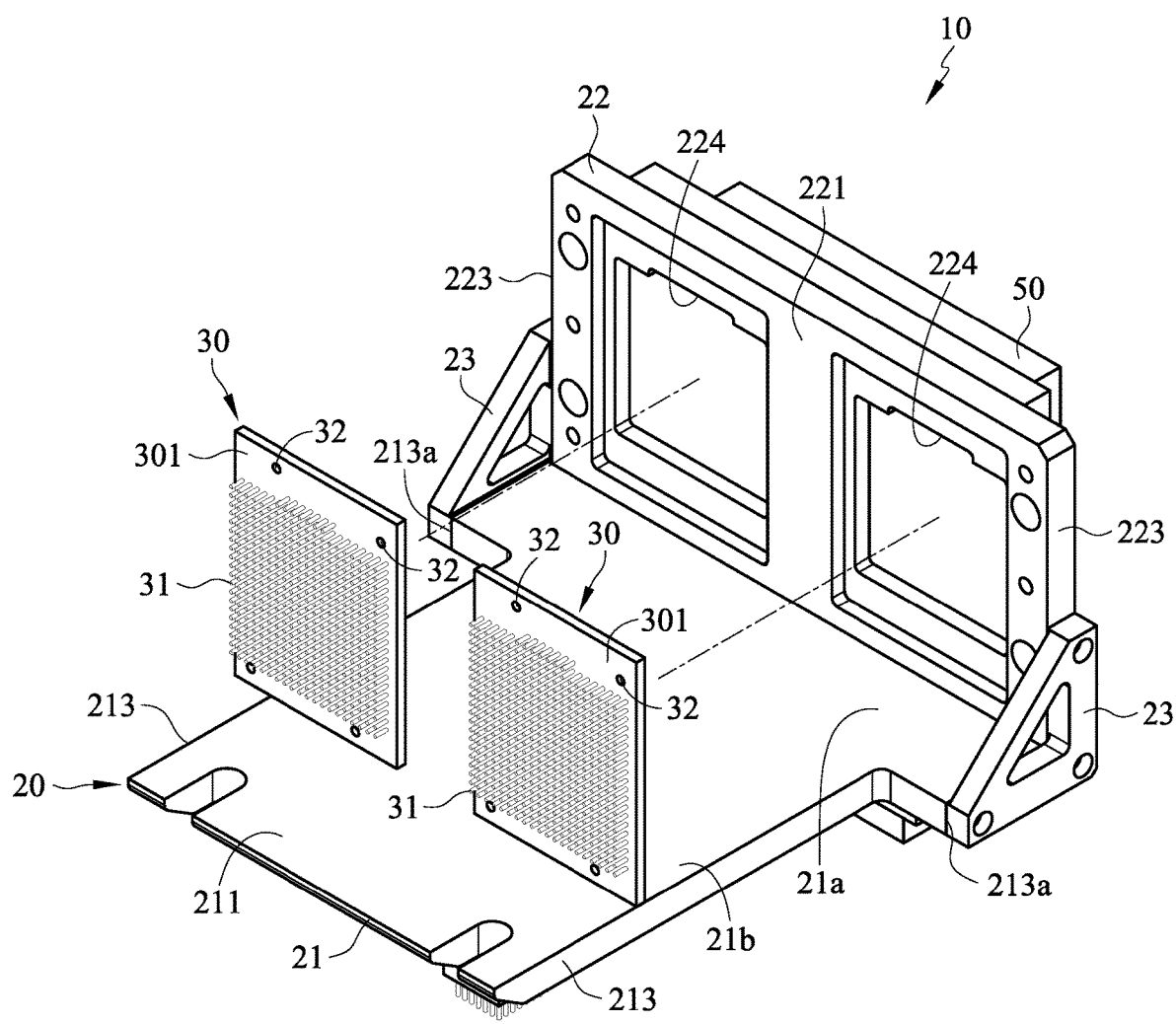
FIG. 1 is an exploded perspective view of a first embodiment of the test head assembly in accordance with the present invention.
Figure 2:
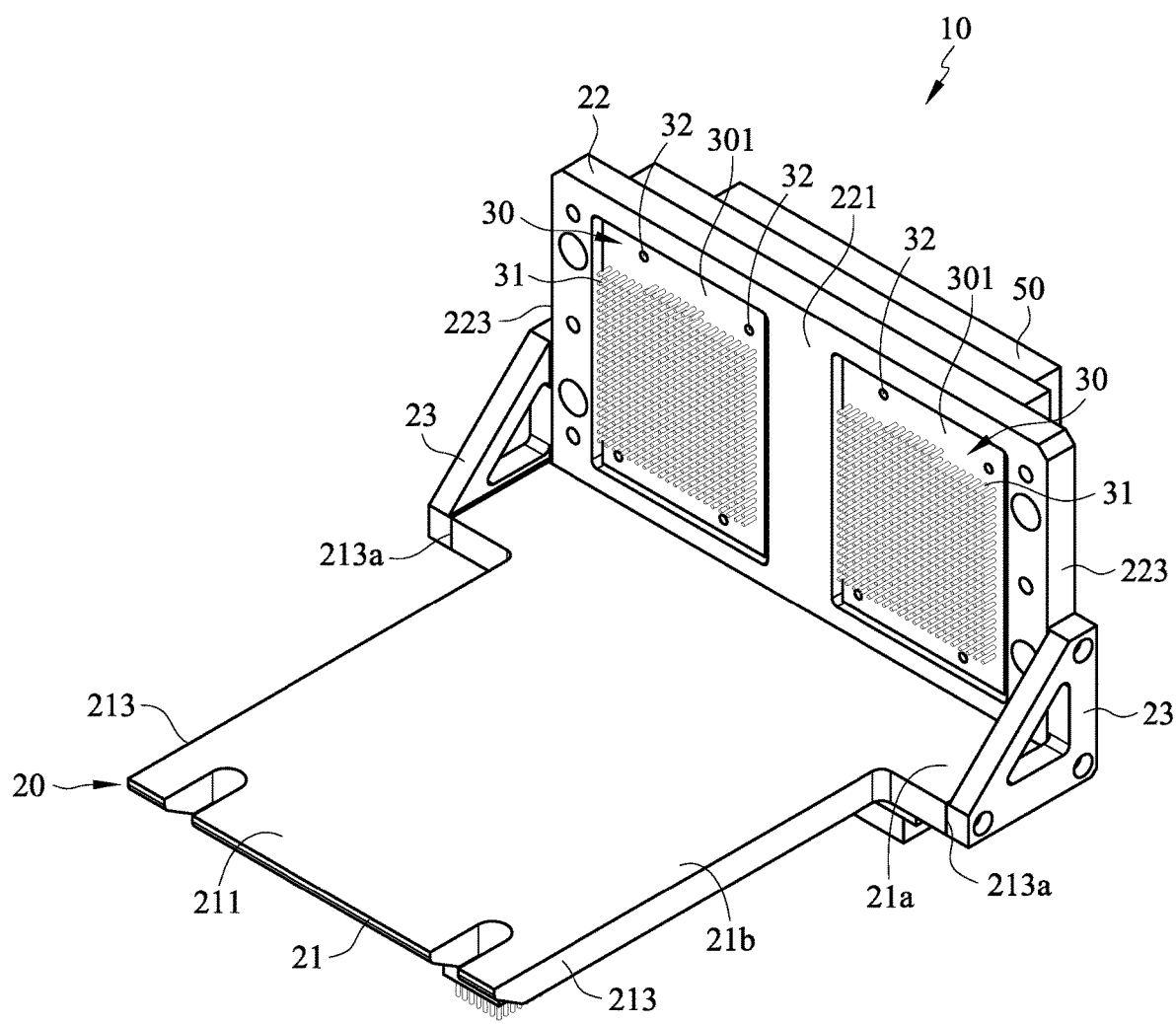
FIG. 2 is a perspective view of the first embodiment of the test head assembly in accordance with the present invention.
Figure 3:
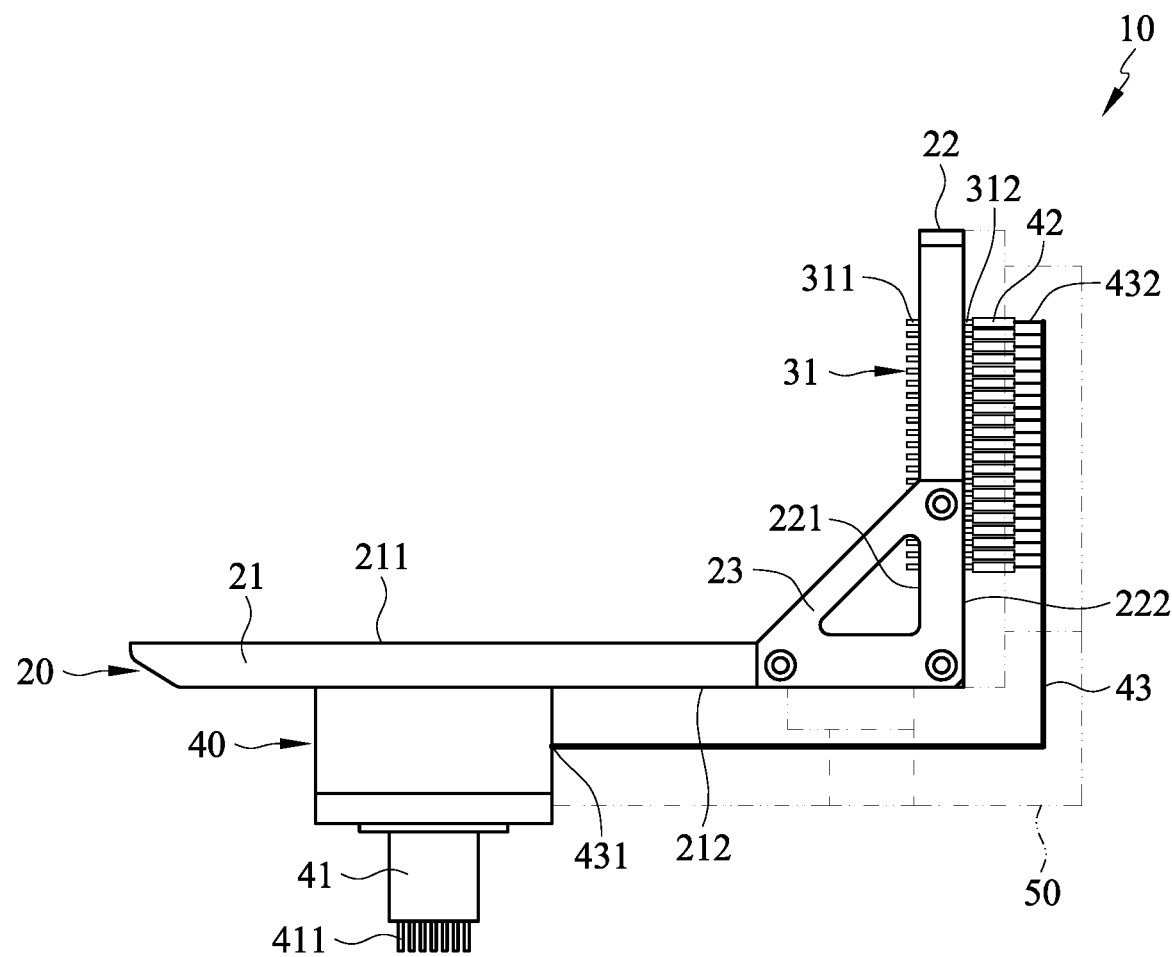
FIG. 3 is a side plan view of the first embodiment of the test head assembly in accordance with the present invention.

With reference to FIGS. 1, 2 and 3, a first embodiment of a test head assembly 10 of the present invention has a carrier 20, at least one pin seat 30, a test wire assembly 40 and a cover 50. The test wire assembly 40 is mounted outside the carrier 20 and partially covered by the cover 50.

The carrier 20 is substantially formed in an L shape. In the present invention, as shown in FIG. 1, the carrier 20 has a lateral board 21, a perpendicular board 22 and two opposite sideboards 23. The sideboard 23 is formed as a triangular board. As shown in FIGS. 1 and 3, the lateral board 21 has an inner sidewall 211, an outer sidewall 212 and two opposite first edges 213. The perpendicular board 22 has an inside 221, an outside 222 and two opposite second edges 223. The perpendicular board 22 is uprightly mounted beside the lateral board 21. The first edges 213 of the lateral board 21 and the second edges 223 consist of two opposite L-shaped edges of the carrier 20. The two sideboards 23 are respectively mounted on the L-shaped edges. In addition, the perpendicular board 22 has a opening 224 is formed through the inside 221 and the outside 222. In the present embodiment, the lateral board 21 further has a wide portion 21a approached to the perpendicular board 22 and a narrow portion 21b departed away from the perpendicular board 22. Each first edge part 213a corresponding to the wide portion 21a is flushed with the corresponding second edge 223 of the perpendicular board 22. In present embodiment, the perpendicular board 22 has two opening 224, but not limited to. The perpendicular board 22 may be a glass fiber board to be lightened.

The at least one pin seat 30 is mounted in the corresponding opening 224 and has a substrate 301, a plurality of pins 31 and a plurality of optional locking holes 32. The pins 31 are mounted on the substrate 30 at the equal intervals. Each pin 31 has an inner end 311 and an outer end 312. The locking holes 32 are formed on peripheries of the substrate 301, on which no pin is mounted. In the present embodiment, as shown in FIG. 1, an amount of the pin seats 30 are equal to the amount of the openings 224. The two pin seats 30 are respectively mounted the two openings 224. In particular, as shown in FIGS. 1 and 2, the peripheries of the substrate 301 correspond to the perpendicular board 22 and a plurality of fixing elements (not shown) respectively pass through the opening 224 to lock the substrate 301 on the perpendicular board 22. With reference to FIG. 3, the inner ends 311 of the pins 31 protrude from the inside 221 of the perpendicular board 22 and the outer ends 312 of the pins 31 protrude from the outside 222 of the perpendicular board 22. Each of the pins 31 is a pogo pin and the inner end 311 is a spring end of the pogo pin for an interface circuit board having different planes.

As shown in FIG. 3, the test wire assembly 40 has a test head 41 and a plurality of connectors 42 and a plurality of test wires 43. The test head 41 is mounted on the outer sidewall 212 of the lateral board 21 and has micro-probe 411. The connectors 42 are respectively connected to the outer ends 312 of the pins 31 of the pin seat 30. The test wires 43 are connected between the test head 41 and the connectors 42 and positioned on the outer sidewall 212 of the lateral board 21 and the outside 222 of the perpendicular board 22. In the present embodiment, each of the connectors 42 is a metal sleeve to cover the outer ends 312 of the pins 31. Each of the test wires 43 has a first end 431 and a second end 432. The first end 431 is connected to the corresponding micro-probe 411 of the test head 41 and the second end 432 is connected to the corresponding connector 42. In one embodiment, each of the micro-probe 411 is a wire probe and an interval between the micro-probes 411 is less than the interval between the pins 31 of the pin set 30. The interval between the micro-probes 411 matches a pitch between two adjacent pads on a semiconductor device to be tested. Each of the connector 42 is a copper sleeve, each of the test wires 43 is a copper wire or an enameled wire, and the first end 431 of the test wire 43 is soldered to the corresponding micro-probe 411.

The cover 50 is mounted on the outer sidewall 212 of the lateral board 21 and the outside 222 of the perpendicular board 22. In the present embodiment, as shown in FIG. 3, the cover 50 covers the outer ends 312 of the pins 31 of the pin seats 30 and the connectors 42 and the test wires 43 of the test wire assembly 40.

Figure 4:
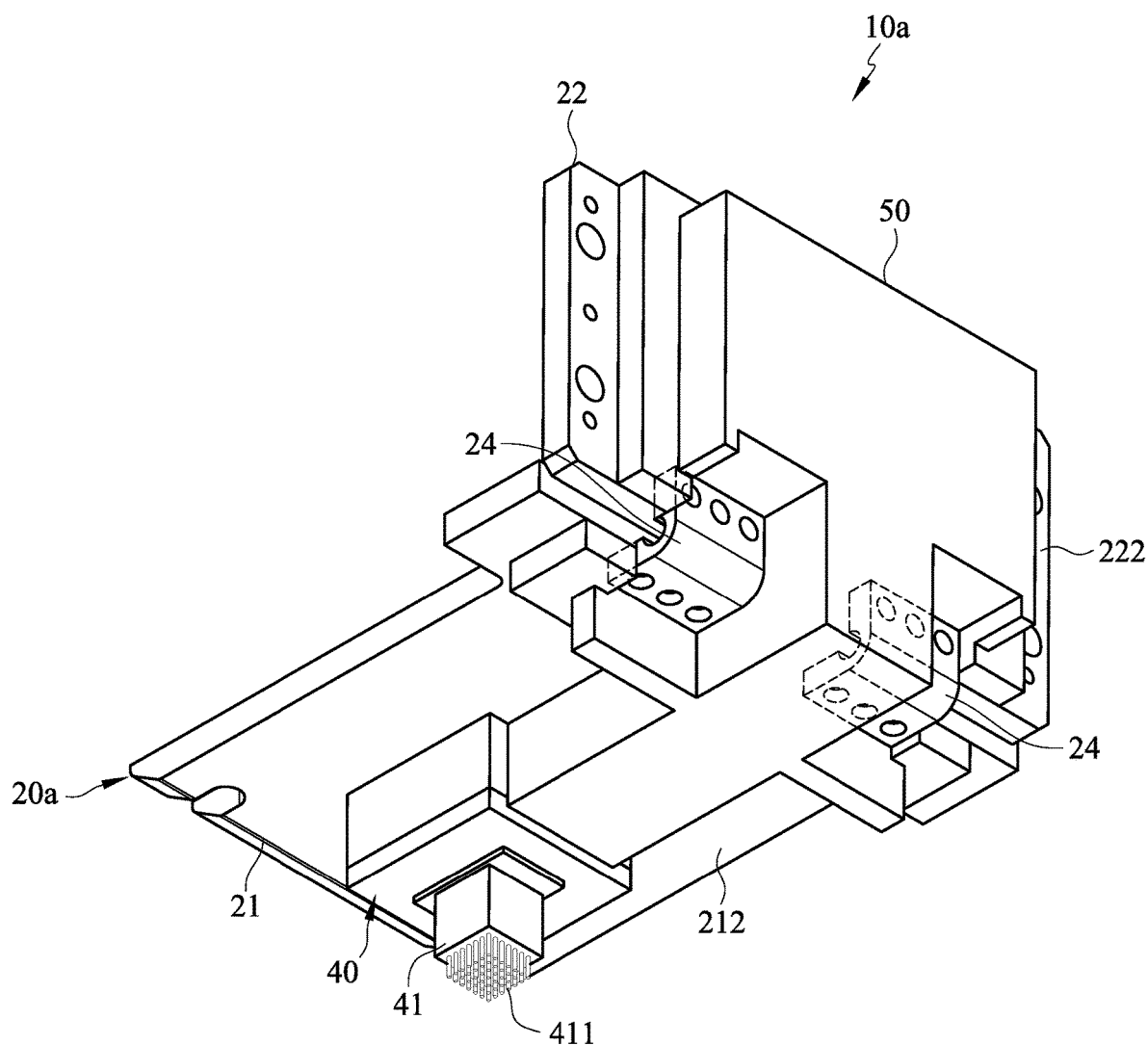
FIG. 4 is a perspective view of a second embodiment of the test head assembly in accordance with the present invention.
Figure 5:
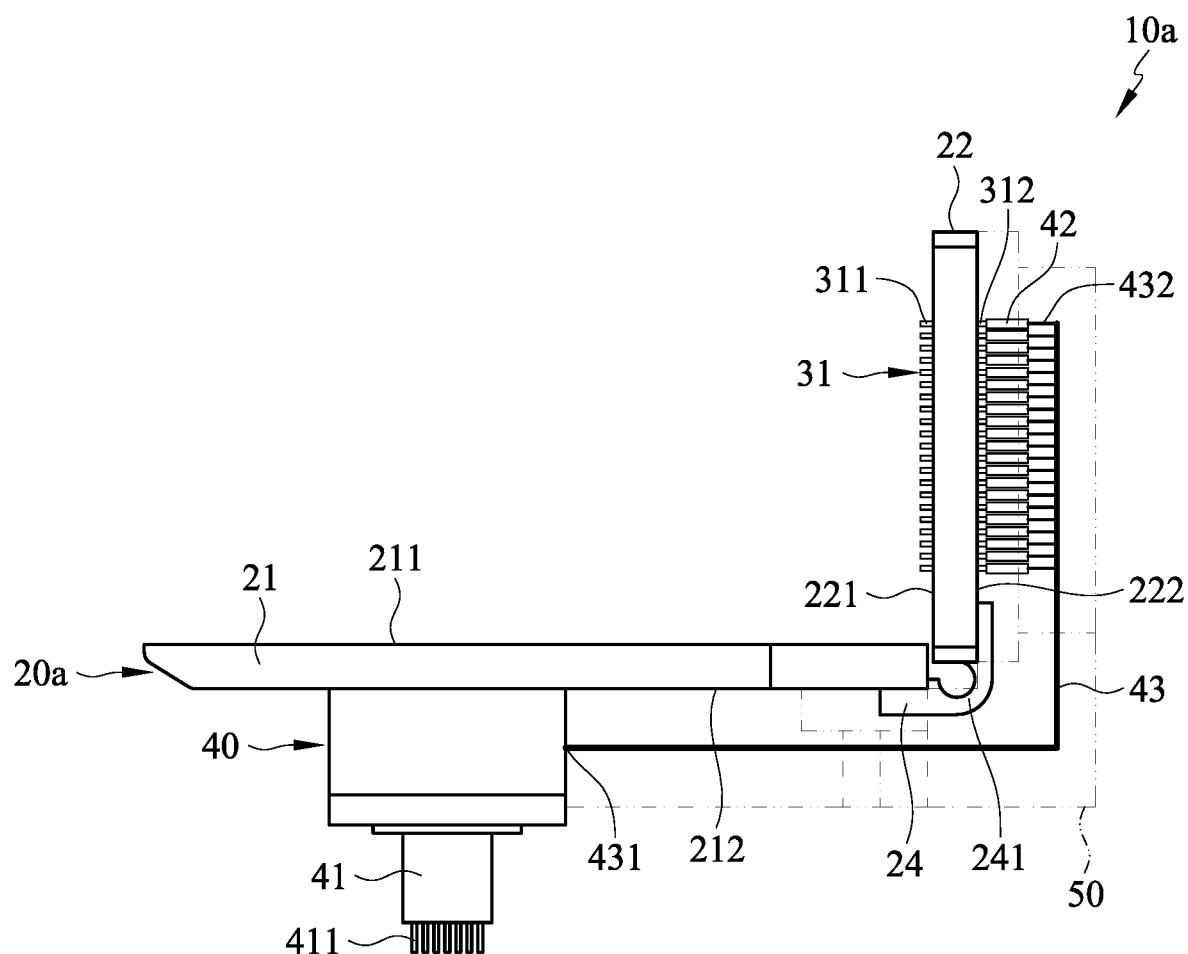
FIG. 5 is a side plan view of the second embodiment of the test head assembly in accordance with the present invention.

With reference to FIGS. 4 and 5, a second embodiment of the test head assembly 10a of the semiconductor device is shown. The test head assembly 10a of the present embodiment is similar to that of the first embodiment, but in the present embodiment, a carrier 20a has a lateral board 21, a perpendicular board 22 and two bent metal plate 24. The perpendicular board 22 is uprightly mounted beside the lateral board 21 and the bent metal plates 24 are mounted between the outer sidewall 212 of the lateral board 21 and the outside 222 of the perpendicular board 22 to form the L-shaped carrier 20a. In the present embodiment, as shown in FIG. 4, the bent metal plate 24 is locked on the outer sidewall 212 of the lateral board 21 and the outside 222 of the perpendicular board 22. As shown in FIG. 5, an arc portion 241 of the bent metal plate 24 is thinner than the rest thereof, so the bent metal plate 24 is slightly flexible.

Figure 6:
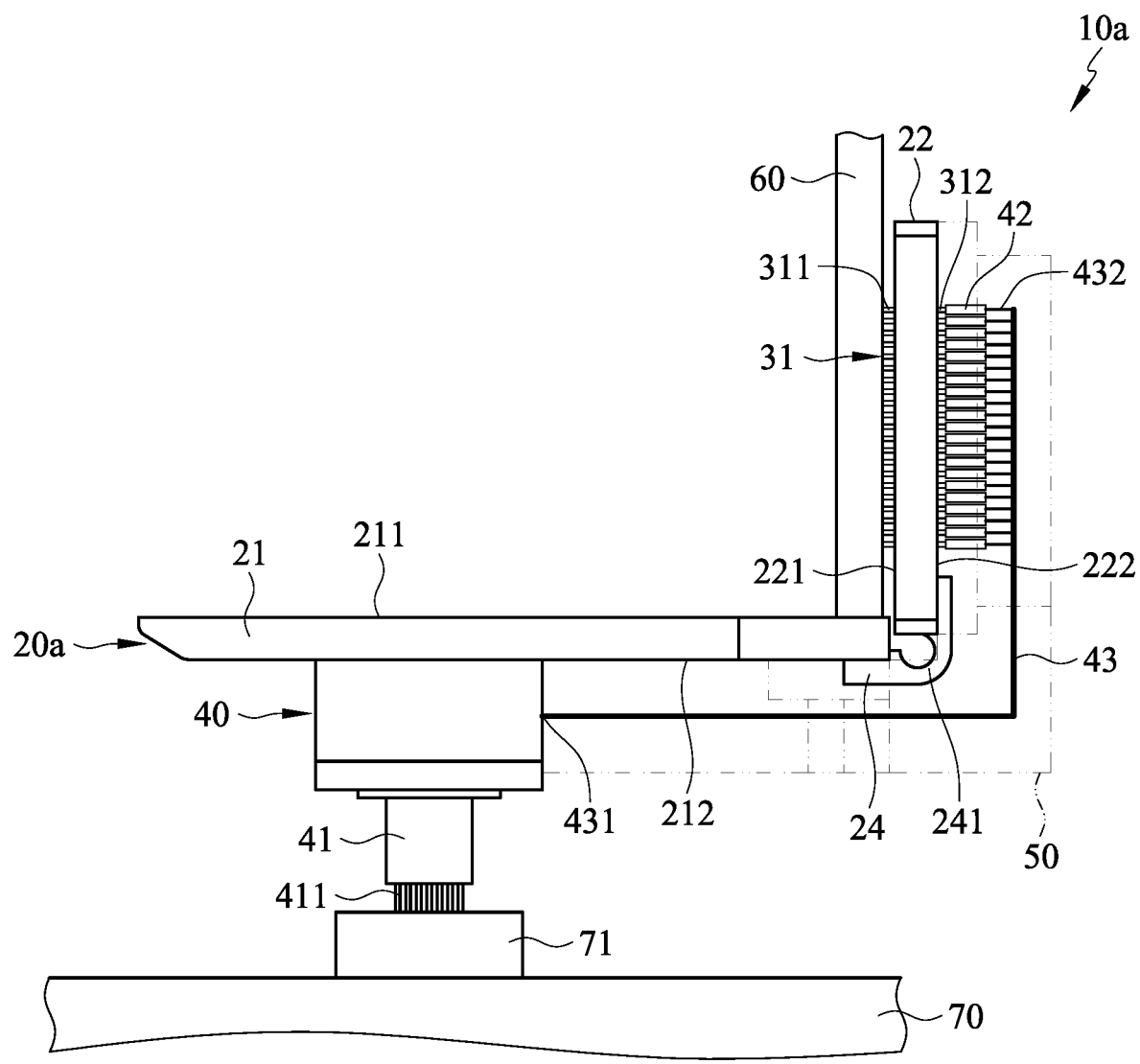
FIG. 6 is a schematic view of the second embodiment of the test head assembly testing a semiconductor device in accordance with the present invention.
Figure 7:
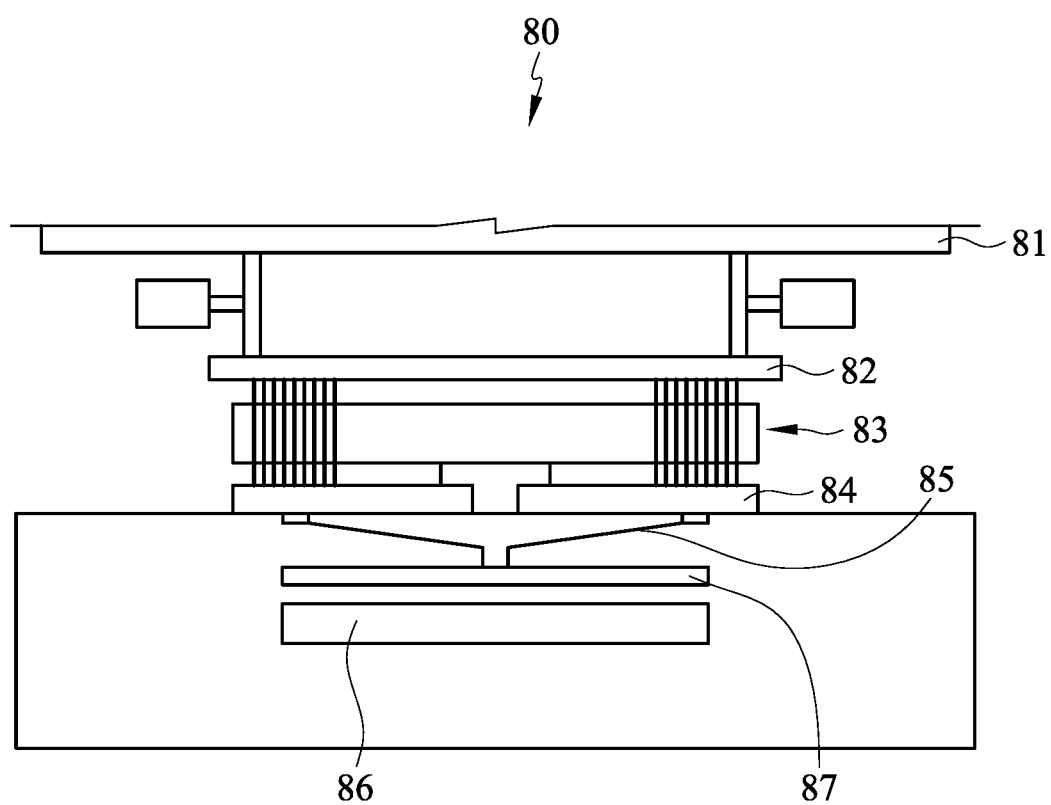
FIG. 7 is a schematic view of a conventional semiconductor image test equipment in accordance with the prior art.

With reference to FIGS. 1 and 6, when the semiconductor device is tested, using the test head assembly 10a as an example, an interface circuit board 60 is mounted on the inner sidewall 211 of the lateral board 21 and is parallel to the pin seat 30. The semiconductor device 71 is mounted on the carrier 70. The interface circuit board 60 is electrically connected to the pins 31 and the semiconductor device 71 is tested through the pins 31. The interface circuit board 60 provides one of the test procedures for the semiconductor device 71 to be tested.

Based on the foregoing description, the present invention provides the L-shaped carrier, the at least one pin seat is mounted on the perpendicular board of the carrier, and the test head is mounted on the lateral board of the carrier. Therefore, the pin seat and the test head are not parallel to each other to reduce a lateral size of the test head assembly. Since the interface circuit board is larger than the pin set, the interface circuit is mounted on the carrier uprightly to occupy less lateral space and increase a space usage. In addition, the test head assembly with less lateral size can help that the micro-probes of the test head accurately align to the pads on the semiconductor device. A stability of the alignment procedure is also increased. When a tolerance is existed between the perpendicular board and the lateral board, the tolerance may be removed by adjusting the bent metal plate mounted therebetween. Therefore, the perpendicular board and the lateral board are assembled flexibly through the bent metal plate.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A test head assembly for a semiconductor device, comprising:
    a carrier substantially having:
        a lateral board;
        a perpendicular board connected to the lateral board to form in an L shape, and
        at least one opening formed through the perpendicular board;
    at least one pin seat mounted in the corresponding opening, substantially perpendicular to the lateral board, and having a plurality of pins, wherein each of the pins has an inner end and an outer end, the inner ends protrude from an inside of the perpendicular board, and the outer ends protrude from an outside of the perpendicular board; and
    a test wire assembly having:
        a test head mounted on an outer sidewall of the lateral board and having a plurality of micro-probes;

a plurality of connectors respectively connected to the outer ends of the pins of the at least one pin seat; and a plurality of test wires respectively connected between the micro-probes and the connectors and positioned alongside the outer sidewall of the lateral board and the outside of the perpendicular board.

2. The test head assembly as claimed in claim 1, wherein the lateral board has two opposite first edges;

the perpendicular board has two opposite second edges, wherein the two second edges are respectively flushed with the two first edges to form two opposite L-shaped sides; and the carrier further comprises two triangular boards respectively mounted on the L-shaped sides.

3. The test head assembly as claimed in claim 1, wherein the carrier further comprises a plurality of bent metal plates, the bent metal plates are respectively mounted between the outer sidewall of the lateral board and the outer sidewall of the perpendicular board, and an arc portion of the bent metal plate is thinner than the lateral board and the perpendicular board thereof.

4. The test head assembly as claimed in claim 1, wherein carrier further comprises a cover mounted on the outer sidewall of the lateral board and the outside of the perpendicular board to cover the outer ends of the pins of the at least one pin seat, the connectors and the test wires.

5. The test head assembly as claimed in claim 2, wherein carrier further comprises a cover mounted on the outer sidewall of the lateral board and the outside of the perpendicular board to cover the outer ends of the pins of the at least one pin seat, the connectors and the test wires.

6. The test head assembly as claimed in claim 3, wherein carrier further comprises a cover mounted on the outer sidewall of the lateral board and the outside of the perpendicular board to cover the outer ends of the pins of the at least one pin seat, the connectors and the test wires.

7. The test head assembly as claimed in claim 1, wherein a first interval between the micro-probes is less than a second interval between the pins of the at least one pin seat; and each test wire is soldered to the corresponding micro-probe.

8. The test head assembly as claimed in claim 2, wherein a first interval between the micro-probes is less than a second interval between the pins of the at least one pin seat; and each test wire is soldered to the corresponding micro-probe.

9. The test head assembly as claimed in claim 3, wherein a first interval between the micro-probes is less than a second interval between the pins of the at least one pin seat; and each test wire is soldered to the corresponding micro-probe.

10. The test head assembly as claimed in claim 1, wherein each of the at least one pin seat further comprises a substrate, and the substrate is locked on the perpendicular board.

11. The test head assembly as claimed in claim 2, wherein each of the at least one pin seat further comprises a substrate, and the substrate is locked on the perpendicular board.

12. The test head assembly as claimed in claim 3, wherein each of the at least one pin seat further comprises a substrate, and the substrate is locked on the perpendicular board.

13. The test head assembly as claimed in claim 1, wherein each of the connectors is a metal sleeve; and the perpendicular board is a glass fiber board.

14. The test head assembly as claimed in claim 2, wherein each of the connectors is a metal sleeve; and the perpendicular board is a glass fiber board.

15. The test head assembly as claimed in claim 3, wherein each of the connectors is a metal sleeve; and the perpendicular board is a glass fiber board.

16. The test head assembly as claimed in claim 1, wherein each of the pins of the at least one pin seat is a pogo pin.

17. The test head assembly as claimed in claim 2, wherein each of the pins of the at least one pin seat is a pogo pin.

18. The test head assembly as claimed in claim 3, wherein each of the pins of the at least one pin seat is a pogo pin.

19. The test head assembly as claimed in claim 16, wherein the inner end of the pin is a spring end.

20. The test head assembly as claimed in claim 18, wherein the inner end of the pin is a spring end.

\* \* \* \* \*